(12) United States Patent
Chang et al.

(10) Patent No.: US 10,942,213 B2
(45) Date of Patent: Mar. 9, 2021

(54) DEVICE AND METHOD FOR TESTING MOTHERBOARD

(71) Applicant: DFI Inc., New Taipei (TW)

(72) Inventors: Chia-yi Chang, New Taipei (TW);
Chien-Ming Yu, New Taipei (TW);
Jheng-Rong Cai, Tainan (TW)

(73) Assignee: DFI Inc., New Taipei (TW)

( * ) Notice: Subject to any disclaimer, the term of this patent is extended or adjusted under 35 U.S.C. 154(b) by 262 days.

(21) Appl. No.: 16/018,213

(22) Filed: Jun. 26, 2018

(65) Prior Publication Data

US 2019/0391201 A1    Dec. 26, 2019

(51) Int. Cl.
*G01R 31/28* (2006.01)
*H02M 3/02* (2006.01)
*G06F 11/30* (2006.01)
*H02M 7/02* (2006.01)

(52) U.S. Cl.
CPC ..... *G01R 31/2808* (2013.01); *G01R 31/2813* (2013.01); *G01R 31/2815* (2013.01); *G01R 31/2834* (2013.01); *G06F 11/3031* (2013.01); *H02M 3/02* (2013.01); *H02M 7/02* (2013.01)

(58) Field of Classification Search
CPC ............ G01R 31/2808; G01R 31/2813; G01R 31/2815; G01R 31/2834; G06F 11/3031; H02M 3/02; H02M 7/02

USPC ......... 324/750.15–750.19, 500, 600, 756.02, 324/76.11, 76.61, 754.01, 754.03–754.26, 324/755.01, 756.03, 763.01

See application file for complete search history.

(56) References Cited

U.S. PATENT DOCUMENTS

| | | | |
|---|---|---|---|
| 2005/0280410 A1 | 12/2005 | Moser et al. | |
| 2013/0055024 A1* | 2/2013 | Fu | G06F 11/24 714/30 |
| 2014/0175884 A1* | 6/2014 | Zhou | G06F 1/26 307/31 |

FOREIGN PATENT DOCUMENTS

TW    201326848 A    7/2013

* cited by examiner

*Primary Examiner* — Melissa J Koval
*Assistant Examiner* — Trung Q Nguyen

(57) ABSTRACT

The device for testing a motherboard includes a power adapter, a first DC-DC converter, and a microcontroller. The power adapter converts an AC input voltage to a DC supply voltage. The DC-DC converter converts the DC supply voltage to a DC voltage at a channel coupled to the motherboard, and adjusts a voltage level of the DC voltage in response to a control signal. The DC-DC converter is enabled according to an enable signal. The microcontroller is configured to provide the control signal and the enable signal, and to determine whether a power on/off operation of the motherboard is normal. The microcontroller is configured to perform a test procedure on the motherboard to obtain a workable voltage range of the motherboard. The voltage level of the DC voltage in the test procedure is dynamically adjusted within a predetermined range around a nominal voltage value of the DC voltage.

28 Claims, 8 Drawing Sheets

DEVICE AND METHOD FOR TESTING MOTHERBOARD

TECHNICAL FIELD

The disclosure relates in general to a device for testing a motherboard, and more particularly to a device capable of providing a controllable DC voltage to the motherboard.

BACKGROUND

Generally, a power supply unit (PSU) converts a general-purpose (mains) alternating current (AC) electric power to a direct current (DC) power for components of a computer, such as a motherboard. Typically, computer power supplies conform to the Advanced Technology (AT) or the Advanced Technology eXtended (ATX) specification. The motherboard is the main printed circuit board (PCB) found in general purpose computers. It holds and allows communication between many of the crucial electronic components of a system, such as the central processing unit (CPU) and memory, and provides connectors for other peripherals. The motherboard may be subject to a large number of power on/power off operations, and therefore there is a need for a device and method for testing the power on/power off of the motherboard. In addition, because there may be various power supply units produced by various manufacturers, there is a need for a device which is capable of simulating various voltage and/or timing conditions introduced by different power supply units.

SUMMARY OF THE INVENTION

The invention is related to a device and method for testing a motherboard. By dynamically adjusting the DC voltage in the test procedure, a workable voltage range of the motherboard can be obtained.

According to one embodiment of the invention, a device for testing a motherboard is provided. The device includes a power adapter, a first DC-DC converter, and a microcontroller. The power adapter converts an AC input voltage to a DC supply voltage. The first DC-DC converter converts the DC supply voltage to a first DC voltage at a first channel coupled to the motherboard, and adjusts a voltage level of the first DC voltage in response to a first control signal. The first DC-DC converter is enabled according to a first enable signal. The microcontroller is configured to provide the first control signal and the first enable signal, and to determine whether a power on/off operation of the motherboard is normal. The microcontroller is configured to perform a test procedure on the motherboard to obtain a workable voltage range of the motherboard. The voltage level of the first DC voltage in the test procedure is dynamically adjusted within a predetermined range around a nominal voltage value of the first DC voltage.

According to another embodiment of the invention, a method for testing a motherboard is provided. The method includes the following steps. Convert, by a power adapter, an AC input voltage to a DC supply voltage. Provide, by a microcontroller, a first control signal and a first enable signal. Convert, by a first DC-DC converter, the DC supply voltage to a first DC voltage at a first channel coupled to the motherboard, wherein the first DC-DC converter is enabled according to the first enable signal. Adjust, by the first DC-DC converter, a voltage level of the first DC voltage in response to the first control signal. Determine, by the microcontroller, whether a power on/off operation of the motherboard is normal. Perform, by the microcontroller, a test procedure on the motherboard to obtain a workable voltage range of the motherboard, wherein the voltage level of the first DC voltage in the test procedure is dynamically adjusted within a predetermined range around a nominal voltage value of the first DC voltage.

The above and other aspects of the invention will become better understood with regard to the following detailed description of the preferred but non-limiting embodiment(s). The following description is made with reference to the accompanying drawings.

Figure 1:
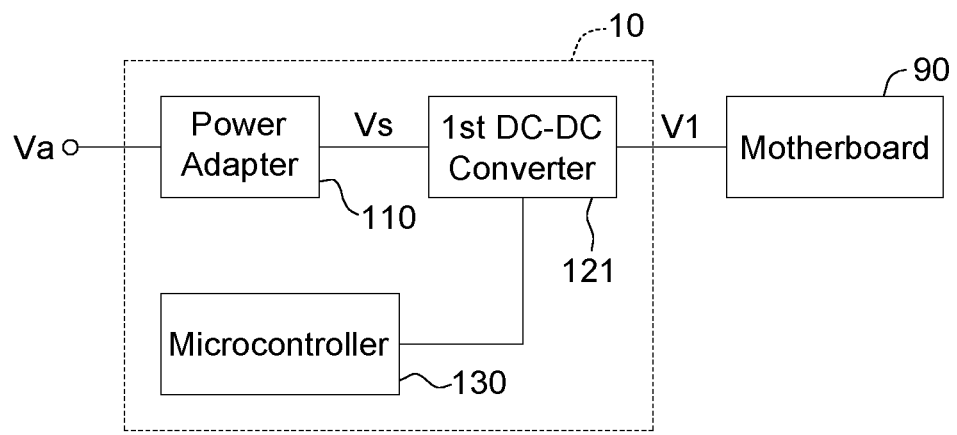
FIG. 1 shows a block diagram of a device for testing a motherboard according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a block diagram of a device 10 for testing a motherboard 90 according to one embodiment of the disclosure. The device 10 includes a power adapter 110, a first DC-DC converter 121, and a microcontroller 130. The power adapter 110 converts an AC input voltage Va to a DC supply voltage Vs. For example, the AC input voltage Va is AC 110V or AC 220V from the mains, and the DC supply voltage Vs is DC 24V.

The first DC-DC converter 121 converts the DC supply voltage Vs to a first DC voltage V1 at a first channel coupled to the motherboard 90, and adjusts a voltage level of the first DC voltage V1 in response to a first control signal. The first DC-DC converter 121 is enabled according to a first enable signal. In one embodiment, the first DC-DC converter 121 may be a controllable step-down converter, which may be implemented by an integrated circuit (IC), such as a digital power IC. In one embodiment, the first DC-DC converter 121 may include a digital-to-analog converter, for converting the first control signal in digital form to the first DC voltage V1. The first control signal may control the voltage level of the first DC voltage V1. The first enable signal may enable the output of the first DC voltage V1, effectively controlling the timing of the first DC voltage V1. In the embodiment shown in FIG. 1, there is one DC-DC converter in the device 10. However, the invention is not limited thereto. There may be two, three, or even more DC-DC converters in the device 10 in other embodiments.

The microcontroller 130 may include a processor and a memory. The memory (such as flash memory) may store a program that can be executed by the processor. In other words, the microcontroller 130 may be programmed to perform specific functions. The microcontroller 130 is configured to provide the first control signal and the first enable signal, and to determine whether a power on/off operation of the motherboard 90 is normal. The microcontroller 130 is configured to perform a test procedure on the motherboard 90 to obtain a workable voltage range of the motherboard 90. The voltage level of the first DC voltage V1 in the test procedure is dynamically adjusted within a predetermined range around a nominal voltage value of the first DC voltage V1.

Figure 2:
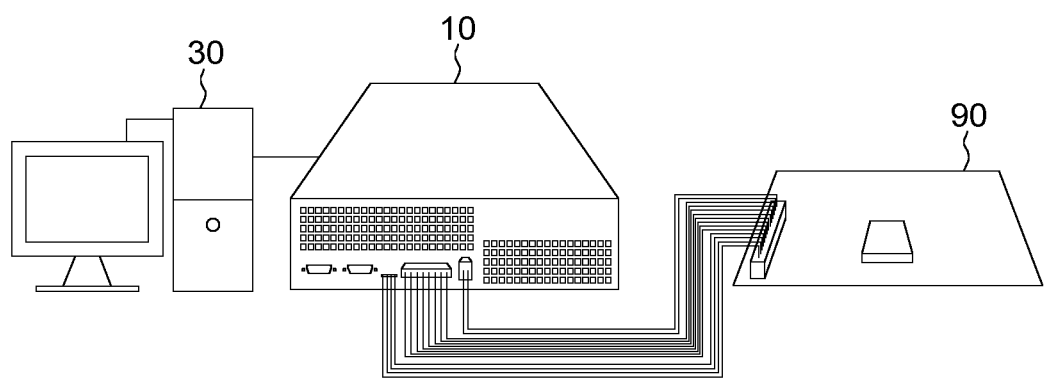
FIG. 2 shows a diagram illustrating a host computer, a motherboard, and the device for testing the motherboard according to one embodiment of the disclosure.

FIG. 2 shows a diagram illustrating a host computer, a motherboard, and the device for testing the motherboard according to one embodiment of the disclosure. In this embodiment, the device 10 is coupled to the motherboard 90 through multiple wires, which may form an ATX power connector for example. These wires may exchange data between the device 10 and the motherboard 90 for performing the test procedure. The device 10 for testing the motherboard 90 may also be coupled to a host computer 30. The host computer 30 may serve for two purposes: (a) providing an interface to program the microcontroller 130 within the device 10; and (b) providing an interface to receive user settings and display information related to the test procedure. In one embodiment, the host computer 30 may be coupled to the device 10 through a universal serial bus (USB) interface.

Figure 3:
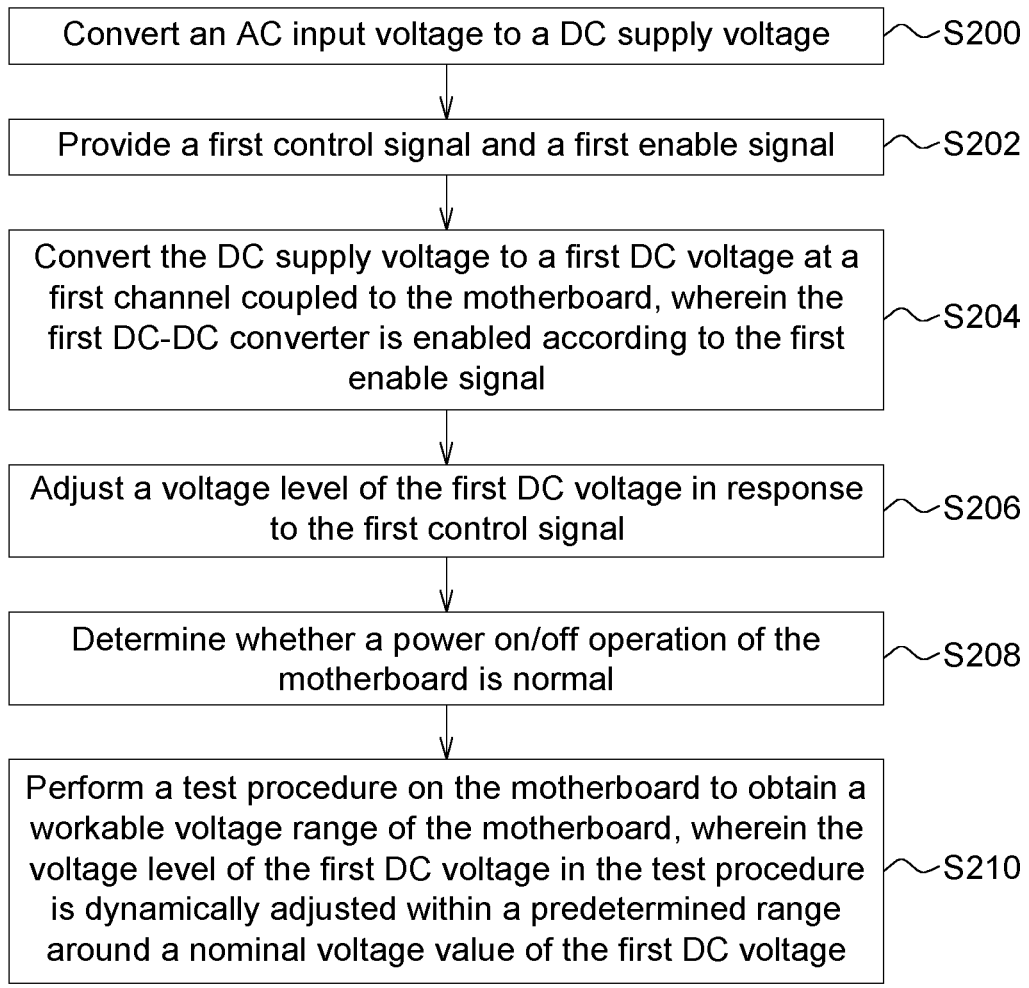
FIG. 3 shows a flowchart of a method for testing a motherboard according to one embodiment of the disclosure.

FIG. 3 shows a flowchart of a method for testing a motherboard according to one embodiment of the disclosure. The method shown in FIG. 3 may be performed by the device 10 shown in FIG. 1. The method for testing the motherboard includes the following steps. Step S200: Convert an AC input voltage to a DC supply voltage. Step S200 may be performed by the power adapter 110. Step S202: Provide a first control signal and a first enable signal. Step S202 may be performed by the microcontroller 130. Step S204: Convert the DC supply voltage to a first DC voltage at a first channel coupled to the motherboard. Step S204 may be performed by the first DC-DC converter 121. The first DC-DC converter 121 is enabled according to the first enable signal. Step S206: Adjust a voltage level of the first DC voltage in response to the first control signal. Step S204 may be performed by the first DC-DC converter 121. Step S208: Determine whether a power on/off operation of the motherboard is normal. Step S210: Perform a test procedure on the motherboard to obtain a workable voltage range of the motherboard, wherein the voltage level of the first DC voltage in the test procedure is dynamically adjusted within a predetermined range around a nominal voltage value of the first DC voltage. Step S208 and step S210 may be performed by the microcontroller 130.

Figure 4:
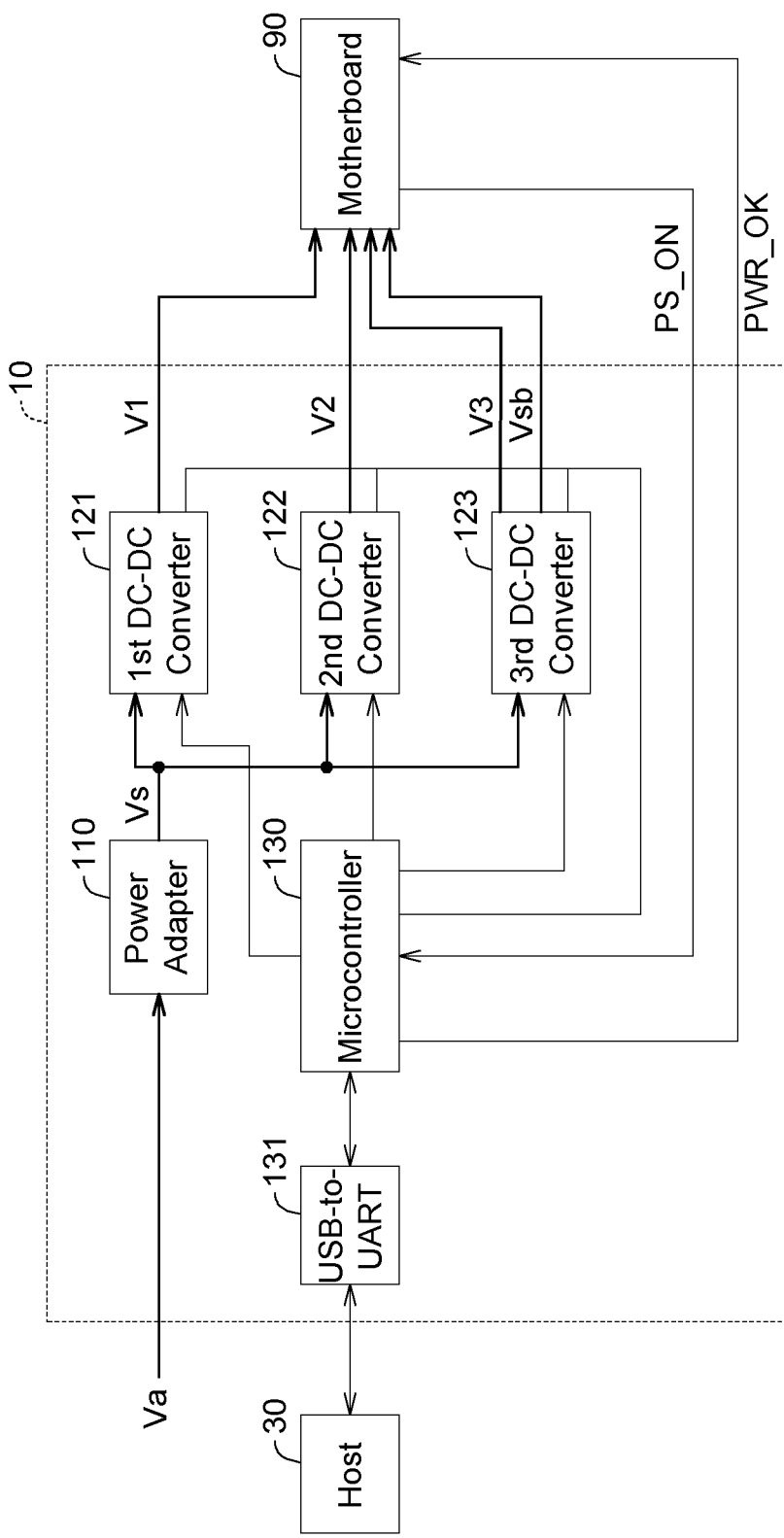
FIG. 4 shows a block diagram of a device for testing a motherboard according to another embodiment of the disclosure.

FIG. 4 shows a block diagram of a device for testing a motherboard according to another embodiment of the disclosure. In this embodiment, the device 10 includes the first DC-DC converter 121, the second DC-DC converter 122, and the third DC-DC converter 123. The second DC-DC converter 122 converts the DC supply voltage Vs to a second DC voltage V2 at a second channel coupled to the motherboard 90, and adjusts a voltage level of the second DC voltage V2 in response to a second control signal. The second DC-DC converter 122 is enabled according to a second enable signal. The third DC-DC converter 123 converts the DC supply voltage Vs to a third DC voltage V3 at a third channel coupled to the motherboard 90, adjusts a voltage level of the third DC voltage V3 in response to a third control signal, converts the DC supply voltage Vs to a DC standby voltage Vsb at a fourth channel coupled to the motherboard 90, and adjusts a voltage level of the DC standby voltage Vsb in response to a fourth control signal. The third DC-DC converter 123 is enabled according to a third enable signal. For example, the ATX specification requires the power supply to produce three main outputs, 12V, 5V, 3.3V and a standby power 5 VSB. The first voltage V1, the second DC voltage V2, the third DC voltage V3, and the DC standby voltage Vsb may be corresponding to 12V, 5V, 3.3V, and 5 VSB, respectively.

In general, the standby power 5 VSB can be used to power the circuitry in the motherboard 90 that controls the power-on signal (PS_ON signal shown in FIG. 4). The PS_ON signal is a signal sent from the motherboard 90 to the device 10. For example, the power supply is turned on when the PS_ON signal is pulled down to ground by the motherboard 90. According to the ATX specification, initially 5 VSB is provided to the motherboard 90 when the rest of the supply wire lines are off. When a power button is pressed, the PS_ON signal is pulled low. After the device 10 detects that the PS_ON signal has been pulled to low, the device 10 controls the three DC-DC converters 121-123 to supply power 12V, 5V, 3.3V to the motherboard 90. Then the device 10 will send a power good signal (PWR_OK signal shown in FIG. 4) to the motherboard 90 a certain amount of time after 12V, 5V, 3.3V are provided. The PWR_OK signal is to indicate that the output voltages generated by the device 10 have stabilized and are ready for use. In one embodiment, the microcontroller 130 is configured to provide the power good signal of the device 10 and control timing of the power good signal.

The device 10 in FIG. 4 further includes a USB-to-UART controller 131, which provides USB connectivity to the microcontroller 130 with a UART (Universal Asynchronous Receiver/Transmitter) interface. The device 10 provides display information to the host computer 30 through the USB interface such that a graphical user interface can be displayed on the host computer 30. In addition, a user may edit the program code on the host computer 30 and then write the program code to the microcontroller 130 through the USB interface. In one embodiment, the microcontroller 130 is powered by the host computer through the USB interface (e.g. +5V supply) when the microcontroller 130 is programmed. In other words, the device 10 does not need to receive the AC input voltage Va when the microcontroller 130 is programmed. The programming operation can be achieved by simply plugging the device 10 into the USB port of the host computer 30. This approach effectively saves unnecessary power consumption and reduces the noise caused by the operation of the device 10, also improves the usage convenience for the user editing the program code.

Each of the DC-DC converters 121-123 may be coupled to the microcontroller 130 through the I²C (Inter-Integrated Circuit) bus. The operating principles of the three DC-DC converters 121-123 are similar, and the first DC-DC converter 121 will be used as an example in the following description. The microcontroller 130 may send the first enable signal to control when the first DC-DC converter 121 starts to output the first DC voltage V1. In one embodiment, the microcontroller 130 is configured to dynamically adjust a first delay time of the first enable signal in the test procedure, such that the delay time of the first DC voltage V1 can be controlled. Similarly, the microcontroller 130 may dynamically adjust a second delay time of the second enable signal, a third delay time of the third enable signal, and a fourth delay time of the power good (PWR_OK) signal in the test procedure. Since the delay time and the voltage level of the first DC voltage V1, the second DC voltage V2, the third DC voltage V3, and the DC standby voltage Vsb may be controlled, the power sequence provided by the device 10 can be controlled by the microcontroller 130. Because the power sequence provided by the device 10 and the delay time of the power good signal are programmable (for example, the delay time of the power good signal may be set from 100 ms to 500 ms), the device 10 is able to simulate various types of power supply units, including a power supply unit that fails to comply with the ATX specification, or even a power supply unit that does not output the power good signal.

In one embodiment, the microcontroller 130 is configured to determine whether the power on/off operation of the motherboard 90 is normal by monitoring the power-on signal (PS_ON) from the motherboard 90. For example, the power on operation is determined as unsuccessful if the PS_ON signal is latched in the logic low state. In another embodiment, the microcontroller 130 is configured to determine whether the power on/off operation of the motherboard 90 is normal according to a first power state signal from the first DC-DC converter 121 (likewise for the second DC-DC converter 122 and the third DC-DC converter 123) transmitted on the I²C bus. For example, the digital power IC has an output pin for reporting its state to the microcontroller 130. In still another embodiment, the microcontroller 130 is configured to determine whether the power on/off operation of the motherboard 90 is normal according to other types of data transmitted on a serial port interface (such as RS-232) between the motherboard 90 and the device 10.

In one embodiment, the microcontroller 130 is configured to suspend the device 10 when the power on/off operation of the motherboard 90 is determined as abnormal. For example, the test procedure applied to the motherboard 90 may include a series of power on and power off operations. If one of these operations is determined as abnormal, the microcontroller 130 may suspend the device 10 to halt the test procedure, preventing the motherboard 90 from being forcibly turned on or turned off in an abnormal state. Since the device 10 is suspended automatically, the operator does not have to continuously observe the condition of the device 10. Instead, the operator may check the device 10 at regular intervals, such as every 20 minutes. In one embodiment, the microcontroller 130 is configured to continue operation after waiting a predetermined time period when the power on/off operation of the motherboard 90 is determined as abnormal. The length of the predetermined time period may be programmable. The microcontroller 130 can continue operation after waiting the predetermined time period in order to complete the test procedure.

Figure 5:
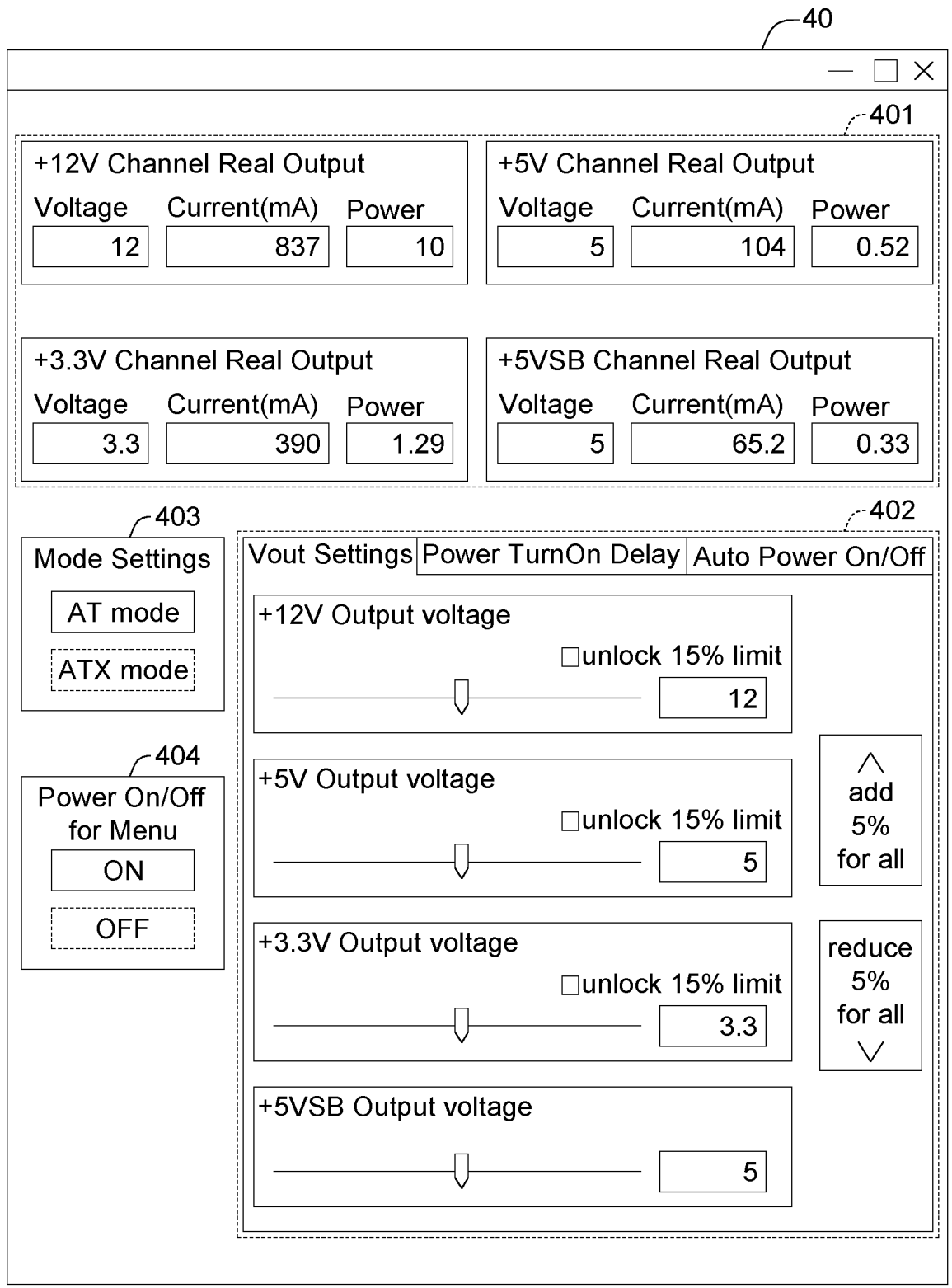
FIG. 5 shows a user interface displayed on the host computer according to one embodiment of the disclosure.

The microcontroller 130 is configured to display a user interface 40 on the host computer 30. FIG. 5 shows a user interface displayed on the host computer according to one embodiment of the disclosure. In this embodiment, the user interface 40 includes several panels 401-404. The panel 401 displays information regarding the voltage, current, and power of each channel, including 12V, 5V, 3.3V, and 5 VSB. For example, the microcontroller 130 is configured to obtain an instantaneous voltage and an instantaneous current at the first channel, and to calculate an instantaneous power at the first channel accordingly (for example, by calculating the product of the instantaneous voltage and the instantaneous current). The instantaneous voltage, the instantaneous current, and the instantaneous power at the first channel are shown on the user interface 40. In one embodiment, the voltage and current information at the first channel may be provided by the first DC-DC converter 121. Similarly, the microcontroller 130 may also obtain the instantaneous voltage and the instantaneous current at other channels. In one embodiment, the microcontroller 130 may calculate the total power consumption by summing up individual power at each channel, and the total power consumption may also be displayed on the panel 401.

The panel 402 is configured to receive various parameters from the user. The panel 402 has three tabs: (a) Vout Settings, (b) Power TurnOn Delay, and (c) Auto Power On/Off. The first tab "Vout Settings" relates to the setting of the voltage level at each channel. In the example shown in FIG. 5, the user may either drag a slider bar on the user interface 40 or type a value in a text box to adjust the voltage level of each channel. Referring to the block diagram shown in FIG. 4, the voltage level at the first channel (+12V) is corresponding to the first control signal sent from the microcontroller 130 to the $1^{st}$ DC-DC converter 121, the voltage level at the second channel (+5V) is corresponding to the second control signal sent from the microcontroller 130 to the $2^{nd}$ DC-DC converter 122, and so on.

In one embodiment, there is a preset adjustable limit imposed on each channel. Taking the first channel as an example, +12V is regarded as the nominal voltage level of the first DC voltage V1. The preset adjustable limit may be within ±5% of the nominal voltage level for safety's consideration, since some devices under test cannot withstand voltage levels exceeding a safety range. In case the user needs to set a voltage level out of the safety range, the user may check a checkbox to unlock 15% limit, such that the voltage level of the first DC voltage V1 is allowed to change within ±15% of the nominal voltage level. This function enables the device 10 to simulate an abnormal power supply unit that provides a voltage level largely deviating from the ideal voltage level. The operations for setting other channels on the user interface 40 are similar and thus are not repeated herein. Two buttons "add 5% for all" and "reduce 5% for all" may be provided on the panel 402 to adjust voltage levels for all channels at once, making the user's operation easier and faster. Note that the numerical values for the voltage range disclosed above (5%, 15%) are exemplary rather than limiting, a person with ordinary skill in the art should appreciate that suitable values may be set according to the applications.

Figure 6:
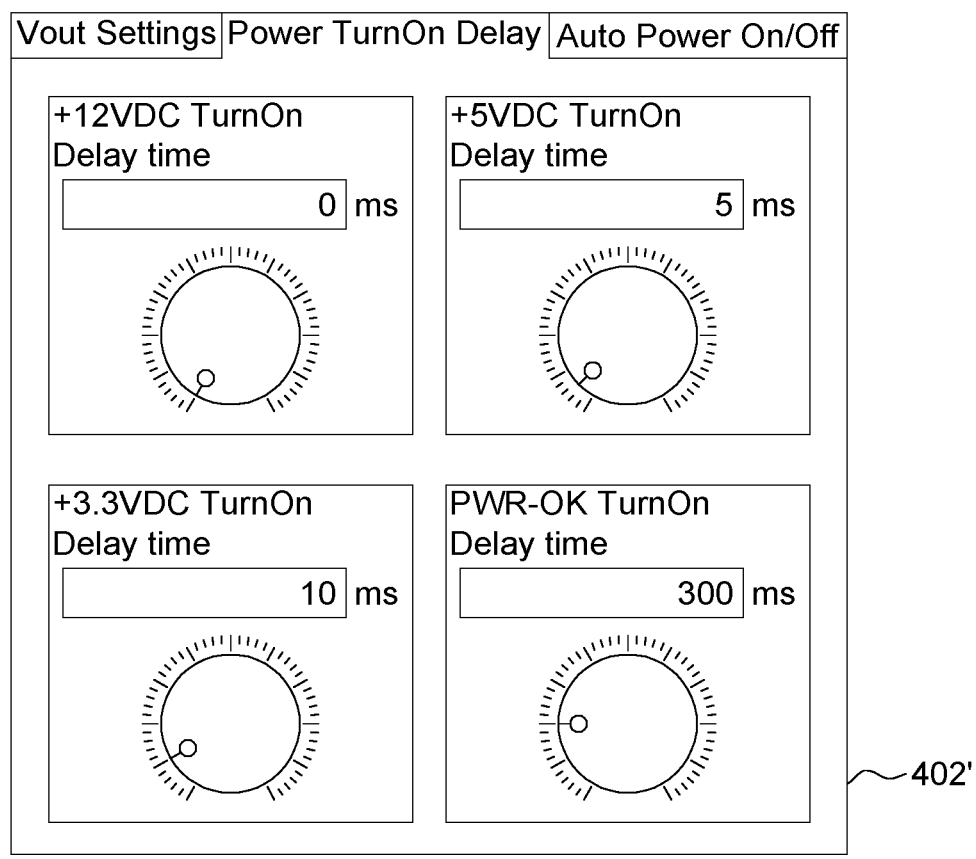
FIG. 6 shows the adjustment of power delay time in the user interface according to one embodiment of the disclosure.

The second tab "Power TurnOn Delay" relates to the setting of the turn-on delay time at each channel. FIG. 6 shows the adjustment of power delay time in the user interface according to one embodiment of the disclosure. In the example shown in FIG. 6, the user may either rotate a knob on the user interface 40 or type a value in a text box to adjust the turn-on delay time of each channel. Referring to the block diagram shown in FIG. 4, the turn-on delay time of the first channel (+12V) is corresponding to the first delay time of the first enable signal sent from the microcontroller 130 to the $1^{st}$ DC-DC converter 121, the second delay time of the second channel (+5V) is corresponding to the second delay time of the second enable signal sent from the microcontroller 130 to the $2^{nd}$ DC-DC converter 122, and so on. According to the ATX specification, the turn-on delay time of each channel is about 20 ms. In one embodiment, the user may deliberately set the turn-on delay time as large as needed (such as 100 ms) to simulate an abnormal power supply unit. The turn-on delay time of the PWR_OK signal located in the bottom-right of the panel 402' represents how long the device 10 waits to send the PWR_OK signal to the motherboard 90 after the output voltages have been successfully generated.

Figure 7:
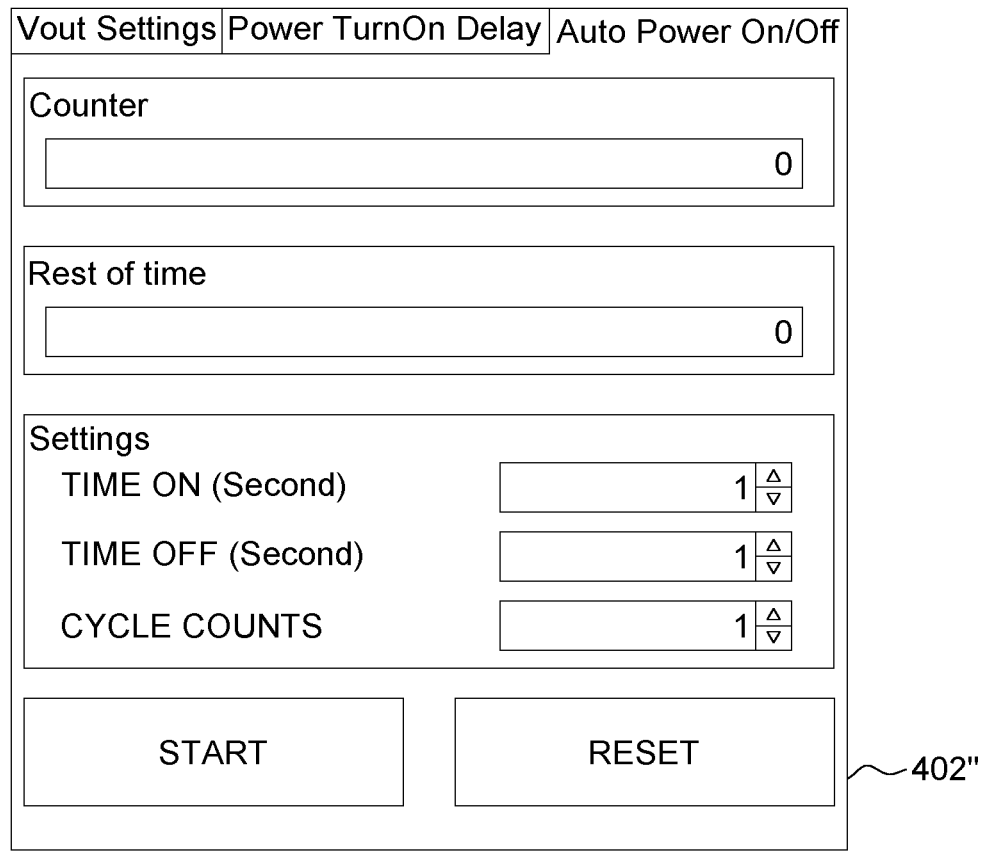
FIG. 7 shows the setting of power on/off operation in the user interface according to one embodiment of the disclosure.
Figure 8:
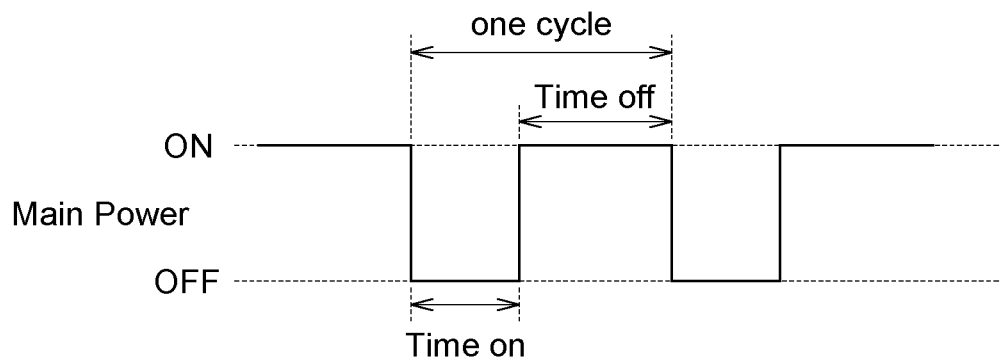
FIG. 8 shows a timing diagram with respect to the setting shown in FIG. 7 according to one embodiment of the disclosure.

The third tab "Auto Power On/Off" relates to the setting of the test procedure. FIG. 7 shows the setting of power on/off operation in the user interface according to one embodiment of the disclosure. In the example shown in FIG. 7, the panel 402" receives three input parameters from the user: time on, time off, and cycle counts. The concerned test procedure includes a sequence of alternately arranged power on operations and power off operations. FIG. 8 shows a timing diagram with respect to the setting shown in FIG. 7 according to one embodiment of the disclosure. The parameter "time on" represents a waiting time for the power on operation, that is, how long the power on operation is executed after the power off operation. Similarly, the parameter "time off" represents a waiting time for the power off operation, that is, has how long the power off operation is executed after the power on operation. One "time on" duration and one "time off" duration constitute one cycle as shown in FIG. 8, and the parameter "cycle counts" represents the total cycle count in the test procedure.

The panel 402" shown in FIG. 7 includes two text boxes "counter" and "rest of time" for displaying information regarding the current state of the test procedure in progress. "Counter" shows the current cycle count in the test procedure, such as the $1^{st}$ cycle, the $2^{nd}$ cycle, the $3^{rd}$ cycle, and so on. "Rest of time" shows the remaining time until the next power on or power off operation, which may be expressed in a countdown format. In addition, the panel 402" shown in FIG. 7 includes two buttons "start" and "reset". In one embodiment, the button "start" is to initiate the test procedure for automatically powering on/off the device under test. The text shown on the button "start" becomes "stop" once the test procedure begins. The button "reset" is to reset the number shown in the "counter" box.

Based on the panel 402 shown in FIG. 5, FIG. 6, and FIG. 7, the user may set the voltage level of each output voltage, the turn-on delay time of each output voltage as well as the power good signal, and the timing parameters related to the test procedure. Further, in one embodiment, the user may specify the voltage level of each output voltage for each power on operation in the test procedure. For example, the test procedure may include ten power on/power off operations, and the user may specify the voltage level of the first DC voltage V1 as 11.0V in the first power on operation, 11.2V in the second power on operation, 11.4V in the third power on operation, 11.6V in the fourth power on operation, and so on. The user may also specify the voltage level of the second DC voltage V2 and the third DC voltage V3 in each power on operation.

In one embodiment, the user may specify a variable range for each output voltage in the test procedure, and the microcontroller 130 is configured to automatically set the voltage level within the specified variable range. For example, the microcontroller 130 may receive a user setting via the user interface 40 including a predetermined range as 10% and a nominal voltage level of the first DC voltage V1 as 12V. Various input methods for the user setting may be applicable, such as typing, adjusting a slider bar, reading a file, etc. The microcontroller 130 may generate the first control signal according to the user setting such that the first DC voltage V1 changes within the predetermined range (10%) around the nominal voltage level (12V). By applying different voltages to the motherboard 90, the microcontroller 130 is able to obtain the workable voltage range of the motherboard 90.

Referring to FIG. 5, the user interface 40 also includes a panel 403 for mode selection. In one embodiment, the microcontroller 130 is configured to switch the operation mode of the device 10 between the AT mode and the ATX mode. This function enables the device 10 to simulate the AT power supply unit as well as the ATX power supply unit. AT-style computer cases have a power button that is directly connected to the system computer power supply. On the other hand, the ATX power supply is typically controlled by an electronic switch. Instead of a hard switch at the main power input, the power button on an ATX system is a sensor input monitored by the computer. ATX systems allow the operating system (OS) to control the final "off" signal to the power supply; this gives the OS time to save all information and complete important tasks before turning off the power supply using a dedicated output signal (PS_ON signal shown in FIG. 4). ATX power supplies also support lower power modes. They have an additional "Standby" power output (Vsb shown in FIG. 4) that stays on to power standby devices whenever the system goes into low-power mode. The microcontroller 130 is configured to perform the control flow in either FIG. 9 or FIG. 10 according to the mode selection made in the panel 403.

Figure 9:
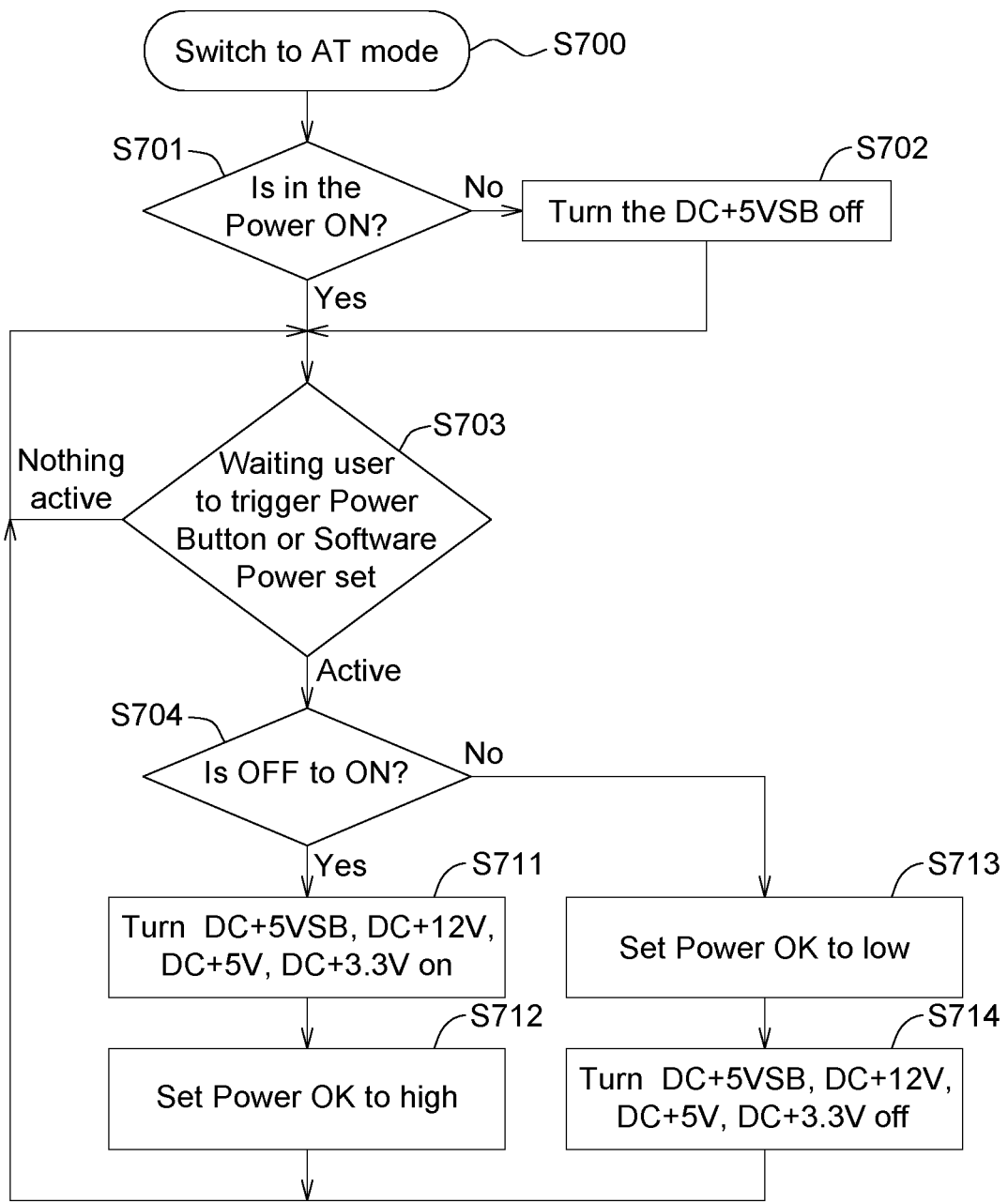
FIG. 9 shows a control flow of the AT mode according to one embodiment of the disclosure.

FIG. 9 shows a control flow of the AT mode according to one embodiment of the disclosure. Step S700 is performed if AT mode is selected in the panel 403. Step S701 is for checking whether the device 10 is in the power on state, such as checking whether the AC input voltage Va is provided to the device 10. If not, proceed to step S702 to turn off the DC standby voltage +5 VSB. If yes, proceed to step S703 to wait a user to trigger the power button (either a hardware button or a software button) or set a software power. The software power may be referred to the panel 404 shown in FIG. 5. The panel 404 provides a function to simulate the action of the user pressing the power button. If the power button is triggered or the software power is set ("active" shown in FIG. 9), proceed to step S704 to determine whether it is a power on operation or a power off operation. Otherwise ("nothing active" shown in FIG. 9) go back to step S703 to wait for the trigger condition. If the determination result of step S704 is yes (a power on operation is triggered), DC +5 VSB, DC +12V, DC +5V, and DC +3.3V are turned on in step S711. After that, the power good signal is set to high in step S712. As mentioned before, the turn-on delay time of DC +12V, DC +5V, and DC +3.3V, and the power good signal may be set by the user via the user interface 40 (one example is shown in FIG. 6). If the determination result of step S704 is no (a power off operation is triggered), the power good signal is set to low in step S713. After that, DC +5 VSB, DC +12V, DC +5V, and DC +3.3V are turned off in step S714.

Figure 10:
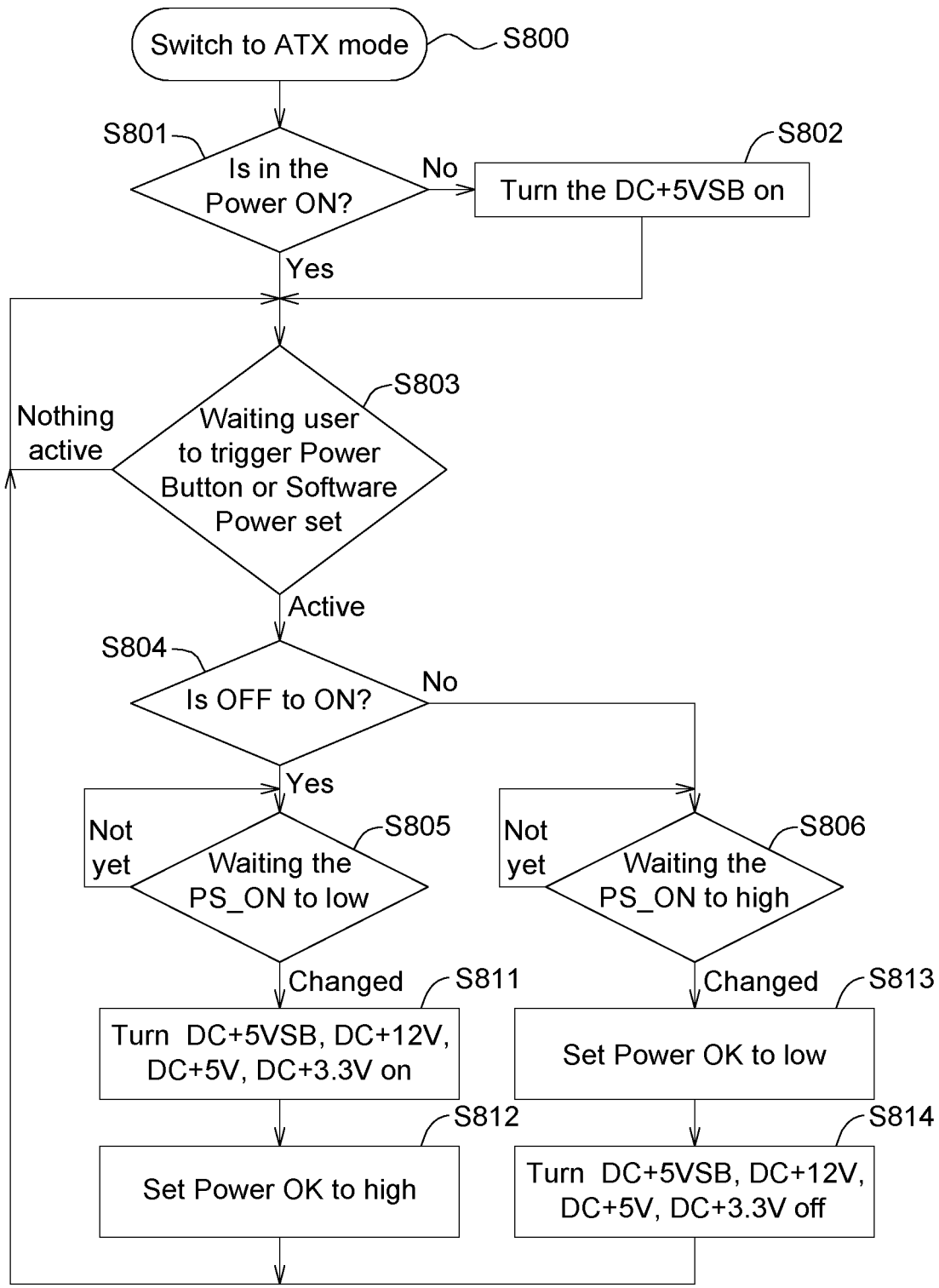
FIG. 10 shows a control flow of the ATX mode according to one embodiment of the disclosure.

FIG. 10 shows a control flow of the ATX mode according to one embodiment of the disclosure. Step S800 is performed if ATX mode is selected in the panel 403. Steps S801-S804 and steps S811-S814 shown in FIG. 10 are similar to steps S701-S704 and steps S711-S714 shown in FIG. 9 respectively, and thus are not repeated herein. One difference between the AT mode and the ATX mode is the introduction of the PS_ON signal. As shown in FIG. 10, if the determination result of step S804 is yes (a power on operation is triggered), proceed to step S805 to wait the PS_ON signal to be set to low. After the PS_ON signal changes to low, proceed to steps S811 and S812. Similarly, if the determination result of step S804 is no (a power off operation is triggered), proceed to step S806 to wait the PS_ON signal to be set to high. After the PS_ON signal changes to high, proceed to steps S813 and S814.

According to the embodiments given in this disclosure, a device capable of simulating various power supply units is provided. The output voltage level and the delay time of each output DC voltage can be controlled by a microcontroller, which can be programmed in advance. In addition, a user interface is provided such that a user can specify the output voltage level and the delay time of each output DC voltage. The user interface also enables a selection between the AT mode and the ATX mode and simulates the action of a user pressing the power button. The instantaneous power at each channel can also be monitored on the user interface. Further, an automatic test flow is provided such that the proposed device can automatically alter the output DC voltage within the predetermined range for testing the motherboard. By applying different voltage levels to the motherboard and checking whether the power on/off operation is normal, the workable voltage range of the motherboard can be obtained accordingly.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A device for testing a motherboard, the device comprising:
a power adapter, for converting an AC input voltage to a DC supply voltage;
a first DC-DC converter, for converting the DC supply voltage to a first DC voltage at a first channel coupled to the motherboard, and adjusting a voltage level of the first DC voltage in response to a first control signal, wherein the first DC-DC converter is enabled according to a first enable signal; and
a microcontroller, configured to provide the first control signal and the first enable signal, and to determine whether a power on/off operation of the motherboard is normal;
wherein the microcontroller is configured to perform a test procedure on the motherboard to obtain a workable voltage range of the motherboard, wherein the voltage level of the first DC voltage in the test procedure is dynamically adjusted within a predetermined range around a nominal voltage value of the first DC voltage;
wherein the microcontroller is configured to alternately power on and power off the motherboard in the test procedure, wherein the test procedure defines a first waiting time for the power on operation, a second waiting time for the power off operation, and a total cycle count in the test procedure, where each cycle of the test procedure comprises one power on operation and one power off operation.

2. The device for testing the motherboard according to claim 1, wherein the microcontroller is configured to determine whether the power on/off operation of the motherboard is normal according to a first power state signal from the first DC-DC converter.

3. The device for testing the motherboard according to claim 1, wherein the microcontroller is configured to determine whether the power on/off operation of the motherboard is normal by monitoring a power-on signal from the motherboard.

4. The device for testing the motherboard according to claim 1, wherein the microcontroller is configured to dynamically adjust a first delay time of the first enable signal in the test procedure.

5. The device for testing the motherboard according to claim 1, wherein the microcontroller is configured to provide a power good signal of the device to the motherboard and control timing of the power good signal.

6. The device for testing the motherboard according to claim 1, wherein the microcontroller is configured to obtain an instantaneous voltage and an instantaneous current at the first channel, and to calculate an instantaneous power at the first channel accordingly.

7. The device for testing the motherboard according to claim 1, wherein the microcontroller is configured to suspend the device when the power on/off operation of the motherboard is determined as abnormal.

8. The device for testing the motherboard according to claim 1, wherein the microcontroller is configured to continue operation after waiting a predetermined time period when the power on/off operation of the motherboard is determined as abnormal.

9. The device for testing the motherboard according to claim 1, wherein the microcontroller is configured to switch an operation mode of the device between an AT mode and an ATX mode.

10. The device for testing the motherboard according to claim 1, wherein the microcontroller is configured to display a user interface on a host computer, where an instantaneous voltage, an instantaneous current, and an instantaneous power at the first channel are shown on the user interface.

11. The device for testing the motherboard according to claim 10, wherein the microcontroller is powered by the host computer through a USB interface when the microcontroller is programmed.

12. The device for testing the motherboard according to claim 10, wherein the microcontroller is configured to receive a user setting via the user interface, where the user setting comprises at least one of the predetermined range, a nominal voltage level of the first DC voltage, a first delay time of the first enable signal, a mode selection between an AT mode and an ATX mode, and parameters related to the test procedure.

13. The device for testing the motherboard according to claim 10, wherein the voltage level of the first DC voltage is allowed to change within ±15% of the nominal voltage value on the user interface.

14. The device for testing the motherboard according to claim 1, further comprising:

a second DC-DC converter, for converting the DC supply voltage to a second DC voltage at a second channel coupled to the motherboard, and adjusting a voltage level of the second DC voltage in response to a second control signal, wherein the second DC-DC converter is enabled according to a second enable signal; and a third DC-DC converter, for converting the DC supply voltage to a third DC voltage at a third channel coupled to the motherboard, adjusting a voltage level of the third DC voltage in response to a third control signal, converting the DC supply voltage to a DC standby voltage at a fourth channel coupled to the motherboard, and adjusting a voltage level of the DC standby voltage in response to a fourth control signal, wherein the third DC-DC converter is enabled according to a third enable signal;

wherein the microcontroller is configured to provide the second control signal, the second enable signal, the third control signal, the third enable signal, and the fourth control signal.

15. The device for testing the motherboard according to claim 14, wherein the microcontroller is configured to dynamically adjust a first delay time of the first enable signal, a second delay time of the second enable signal, a third delay time of the third enable signal, and a fourth delay time of a power good signal of the device in the test procedure.

16. A method for testing a motherboard, the method comprising:
converting, by a power adapter, an AC input voltage to a DC supply voltage;
providing, by a microcontroller, a first control signal and a first enable signal;
converting, by a first DC-DC converter, the DC supply voltage to a first DC voltage at a first channel coupled to the motherboard, wherein the first DC-DC converter is enabled according to the first enable signal;
adjusting, by the first DC-DC converter, a voltage level of the first DC voltage in response to the first control signal;
determining, by the microcontroller, whether a power on/off operation of the motherboard is normal; and
performing, by the microcontroller, a test procedure on the motherboard to obtain a workable voltage range of the motherboard, wherein the voltage level of the first DC voltage in the test procedure is dynamically adjusted within a predetermined range around a nominal voltage value of the first DC voltage;
displaying a user interface on a host computer, where an instantaneous voltage, an instantaneous current, and an instantaneous power at the first channel are shown on the user interface;
alternately powering on and powering off the motherboard in the test procedure, wherein the test procedure defines a first waiting time for the power on operation, a second waiting time for the power off operation, and a total cycle count in the test procedure, where each cycle in the test procedure comprises one power on operation and one power off operation;
receiving, by the microcontroller, a user setting via the user interface, where the user setting comprises at least one of the predetermined range, a nominal voltage level of the first DC voltage, a first delay time of the first enable signal, a mode selection between an AT mode and an ATX mode, and parameters related to the test procedure.

17. The method for testing the motherboard according to claim 16, wherein the step of determining whether the power on/off operation of the motherboard is normal comprises determining according to a first power state signal from the first DC-DC converter.

18. The method for testing the motherboard according to claim 16, wherein the step of determining whether the power on/off operation of the motherboard is normal comprises monitoring a power-on signal from the motherboard.

19. The method for testing the motherboard according to claim 16, further comprising:
adjusting, by the microcontroller, the first delay time of the first enable signal dynamically in the test procedure.

20. The method for testing the motherboard according to claim 16, further comprising:
providing, by the microcontroller, a power good signal to the motherboard and controlling timing of the power good signal.

21. The method for testing the motherboard according to claim 16, further comprising:
obtaining, by the microcontroller, the instantaneous voltage and the instantaneous current at the first channel; and
calculating, by the microcontroller, the instantaneous power at the first channel accordingly.

22. The method for testing the motherboard according to claim 16, further comprising:
suspending operation, by the microcontroller, when the power on/off operation of the motherboard is determined as abnormal.

23. The method for testing the motherboard according to claim 16, further comprising:
continuing operation, by the microcontroller, after waiting a predetermined time period when the power on/off operation of the motherboard is determined as abnormal.

24. The method for testing the motherboard according to claim 16, further comprising:
switching, by the microcontroller, an operation mode between the AT mode and the ATX mode.

25. The method for testing the motherboard according to claim 16, further comprising:
powering the microcontroller by the host computer through a USB interface when the microcontroller is programmed.

26. The method for testing the motherboard according to claim 16, wherein the voltage level of the first DC voltage is allowed to change within ±15% of the nominal voltage value on the user interface.

27. The method for testing the motherboard according to claim 16, further comprising:
converting, by a second DC-DC converter, the DC supply voltage to a second DC voltage at a second channel coupled to the motherboard, wherein the second DC-DC converter is enabled according to a second enable signal;
adjusting, by the second DC-DC converter, a voltage level of the second DC voltage in response to a second control signal;
converting, by a third DC-DC converter, the DC supply voltage to a third DC voltage at a third channel coupled to the motherboard, wherein the third DC-DC converter is enabled according to a third enable signal;
adjusting, by the third DC-DC converter, a voltage level of the third DC voltage in response to a third control signal;

converting, by the third DC-DC converter, the DC supply voltage to a DC standby voltage at a fourth channel coupled to the motherboard;

adjusting, by the third DC-DC converter, a voltage level of the DC standby voltage in response to a fourth control signal;

providing, by the microcontroller, the second control signal, the second enable signal, the third control signal, the third enable signal, and the fourth control signal.

28. The method for testing the motherboard according to claim 27, further comprising:

adjusting, by the microcontroller, the first delay time of the first enable signal, a second delay time of the second enable signal, a third delay time of the third enable signal, and a fourth delay time of a power good signal dynamically in the test procedure.

\* \* \* \* \*